United States Patent [19]

Tanuma et al.

[11] Patent Number: 5,059,046
[45] Date of Patent: Oct. 22, 1991

[54] PRINTER CARRIAGE ASSEMBLY HAVING THERMAL DISSIPATING MEANS

[75] Inventors: Jiro Tanuma; Shinichi Katakura, both of Tokyo, Japan

[73] Assignee: Oki Electric Industry Co., Ltd., Tokyo, Japan

[21] Appl. No.: 478,563

[22] Filed: Feb. 12, 1990

Related U.S. Application Data

[63] Continuation of Ser. No. 862,799, May 13, 1986, abandoned.

[30] Foreign Application Priority Data

May 16, 1985 [JP] Japan ............................. 60-102751

[51] Int. Cl.⁵ .......................................... B41J 25/304
[52] U.S. Cl. .................................. 400/320; 400/352; 400/719
[58] Field of Search ............... 400/124, 320, 352, 719; 101/93.04, 93.05

[56] References Cited

U.S. PATENT DOCUMENTS

| 4,037,705 | 7/1977 | Martin | 400/124 |
| 4,109,282 | 8/1978 | Robertson et al. | 358/127 |
| 4,423,969 | 1/1984 | Kobryn | 400/124 |
| 4,462,702 | 7/1984 | Fritz | 400/121 X |
| 4,513,661 | 4/1985 | Melissa | 400/121 X |
| 4,526,486 | 7/1985 | Kikuchi et al. | 400/320 |

FOREIGN PATENT DOCUMENTS

| 0100388 | 2/1984 | European Pat. Off. | 400/124 |
| 16775 | 1/1984 | Japan | 400/719 |

Primary Examiner—Edgar S. Burr
Assistant Examiner—John S. Hilten
Attorney, Agent, or Firm—Wenderoth, Lind & Ponack

[57] ABSTRACT

A printing head drive circuit of a printer is mounted on the side of a carriage having a printing head attached thereto for a allowing said carriage to act as a heat sink. Hereby, no particular cooling means (heat sink, cooling fan and the like) is required for printing head drive elements. In addition, a controller and heat generating parts can be completely separated. Thus, it can be anticipated to reduce the number of parts and the cost required for assembling the whole structure as well as to improve reliability of the printing head drive circuit.

8 Claims, 2 Drawing Sheets

PRINTER CARRIAGE ASSEMBLY HAVING THERMAL DISSIPATING MEANS

This application is a continuation of now abandoned application, Ser. No. 06/862,799 filed on May 13, 1986.

BACKGROUND OF THE INVENTION

1. Field of the invention

The present invention relates to a printer for printing characters, symbols, and patterns etc., and more particularly to a drive circuit for a printing head adapted to have a structure which is to be mounted on the printer.

2. Description of the Prior Art

Printers are widely employed as output devices in various information processing apparatuses such as, for example, peripheral units of electronic computers, terminal equipment connected to telephone lines, and efforts have been made with respect to terminal equipment and peripheral units so as to miniaturize them, and reduce their weights as well as their power consumption with the developments of electronics. Likewise, a great deal of effort has been exerted on printers used as output devices. In particular, for printing heads used in such printers, various systems have been developed for practical use. For example, there are known printing heads for thermal printers each having micro heating elements, seven longitudinally and five transversely, provided on a ceramic substrate as well as another type of printing head for dot-wire printers including seven printing wires longitudinally and driven by an electromagnetic force. FIG. 1 illustrates a drive circuit for driving a dot printing head for use in such a prior art printer, and includes a control unit 1 consisting of a controller 2 including 2 microprocessors, etc., a drive circuit 3 connected to the controller 2 and including drive elements such as transistors, and a connector 4 connected to the drive circuit 3. The connector 4 is connected to a connector 7 provided on a carriage 6 via a connecting cord 5. The carriage 6 has the connector 7 and a printing head 8 connected to the connector 7. Furthermore, the printing head 8 will be described as the printing head for the dot-wire printer described above. Accordingly, printing wires arranged on the printing head 8 are selectively driven, while permitting the carriage 6 to be moved along a printing line, with the aid of the drive circuit 3 operated in accordance with an instruction issued from the controller 2 for allowing any character arranged in a 7×5 dot matrix to be printed. FIG. 2 shows a structure of the drive circuit 3 of the printing head monted on the printer, and includes a drive element 3b which is mounted by means of screws on a heat sink 3a used as a radiator; the heat sink 3a, the controller 2, and the connector 4 are mounted on a printed circuit board 1a which forms a prescribed electrical circuit. However, such a prior art circuit suffers from a drawback that since it has only a printing head, an object to be driven, mounted on the side of the carriage, a larger mounting space for the drive elements is required on the side of the control unit corresponding thereto. More particularly, printers needed for a higher printing quality must respectively have many printing wires. Accordingly, such a printer must include as many drive elements as those corresponding to the number of the printing wires and thus presents severe problems to be solved. In addition, a printing head using such dot wires requires more electrical power to be consumed in drive elements serving to drive loads, thereby requiring much more electric power. Therefore, one can not neglect heat radiation in the drive elements. It is thus necessary to reduce any influence of the heat on the controller, etc., provided on the same curcuit board by mounting heat sinks and cooling fans.

SUMMARY OF THE INVENTION

It is an object of the present invention to provide a simply-structured and miniaturized printer.

Another object of the present invention is to provide a printer which is not affected by heat radiation from the drive elements of the drive circuit for the printing head to the controller.

Still another object of the present invention is to provide a mounted structure of the drive circuit for the printing head not requiring particular heat sinks and cooling fans as cooling means for the drive elements.

To achieve the above objects, a wire dot printer according to the present invention comprises a carriage movably provided in a direction of printing, a printing head fixedly mounted on the carriage for selectively driving a plurality of drive elements for printing, a controller for controlling the driving of the printing head, a drive circuit for driving the drive elements in accordance with the control by the controller, and disposes a drive circuit for the printing head of the printer on a thermally conducting plate mounted on the carriage along with the drive circuit which is also mounted on the thermally conducting plate.

With the arrangement described above, the drive circuit of the printer being a chief heat radiator is mounted on the carriage on the thermally conducting plate acting as a heat sink. A fixed printed circuit board accordingly requires no cooling means. In addition, complete separation of the controller and the heat generating parts from each other, which is assured in the present invention, impoves reliability of the present circuit.

The above and other objects, features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENT

Figure 1:
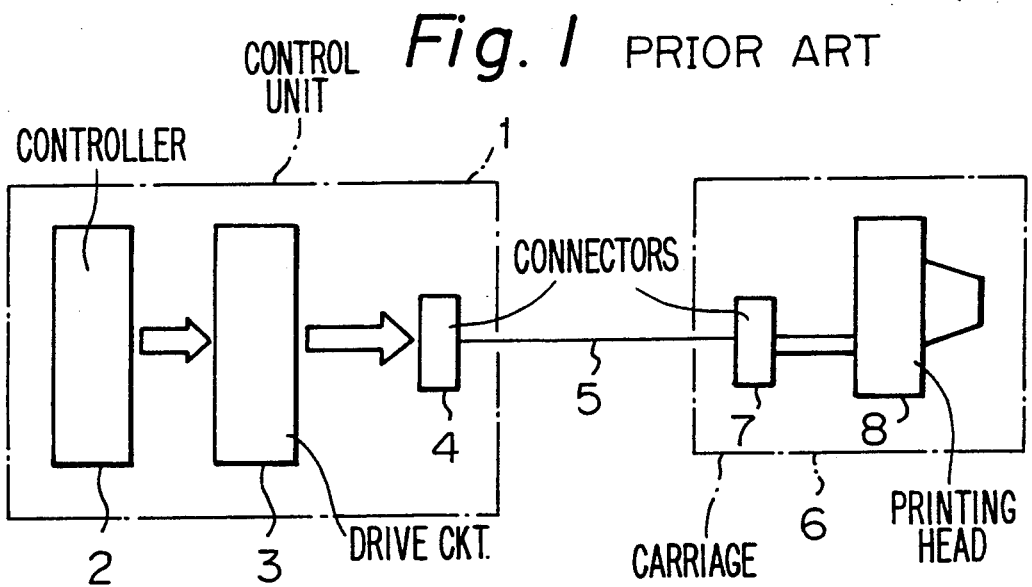
FIG. 1 is a blok diagram illustrating a prior art head drive circuit.
Figure 2:
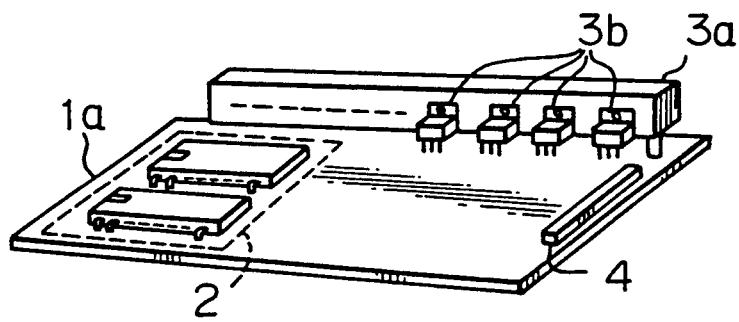
FIG. 2 is a view illustrating a mounted structure of a prior art control unit.
Figure 3:
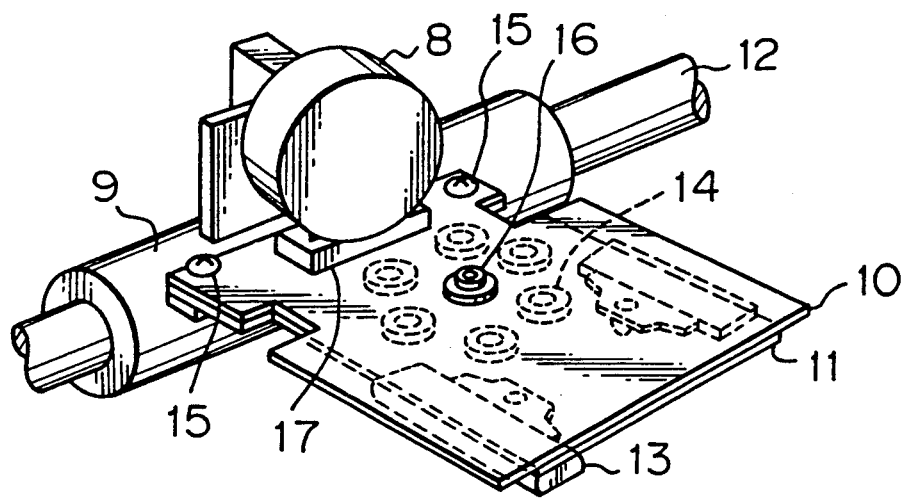
FIG. 3 is an exemplary carriage structure according to the present invention.
Figure 4:
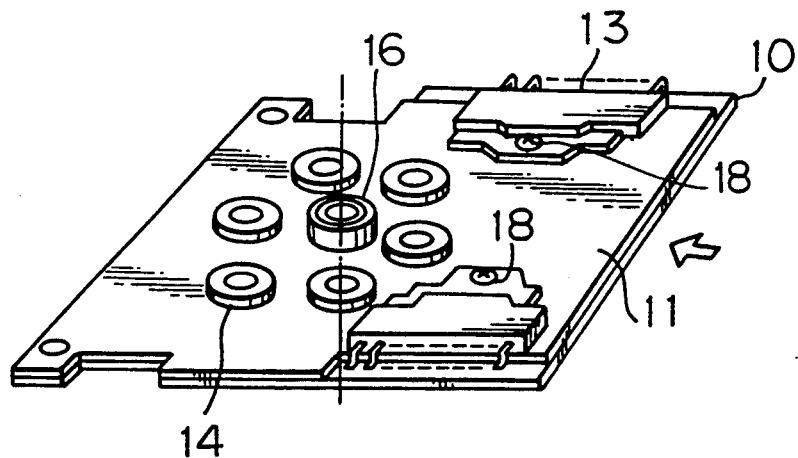
FIG. 4 is a perspective view of the structure of FIG. 3 viewed from the rear surface thereof.
Figure 5:
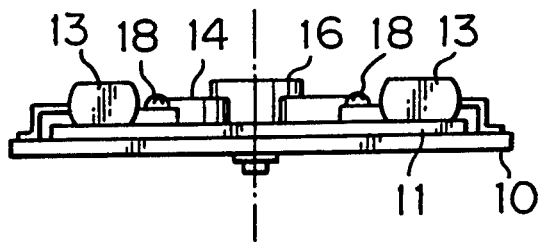
FIG. 5 is a cross sectional view of FIG. 4.
Figure 6:
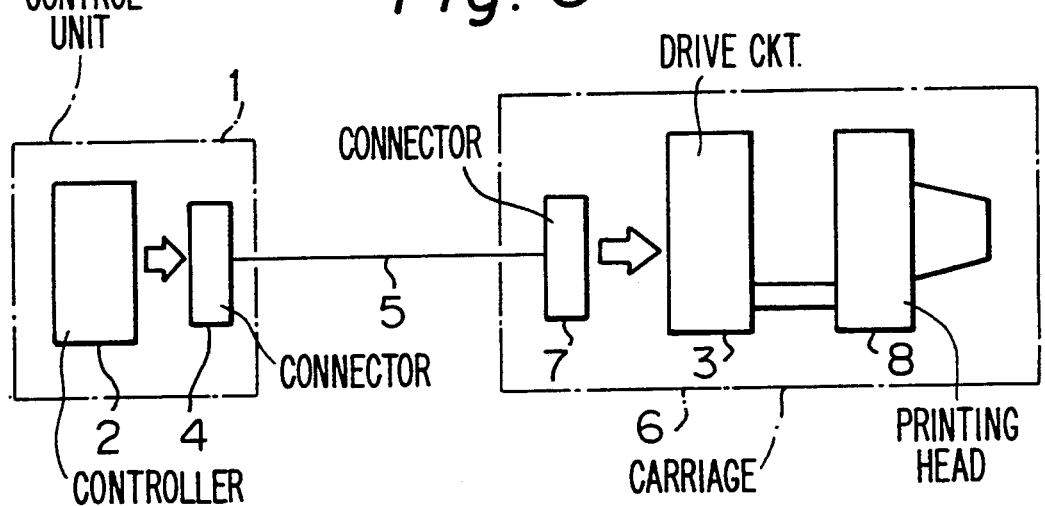
FIG. 6 is a block diagram illustrating a head drive circuit according to the present invention.

The following is a description of an embodiment of a drive circuit for a printing head in a printer according to the present invention with reference to FIGS. 3–6. The basic electrical arrangement of the present invention is illustrated in FIG. 6, but the arrangement is substatially the same as that described before for the prior art referring to FIG. 1. Accordingly, a detailed description thereof has been omitted. FIGS. 3–5 illustrate a carriage of a printer for printing a line of characters while moving a printing head in a direction of printing; element 9 is an aluminum die casting carriage frame for fixing a space motor assembly including a printing head 8 and a printing drive circuit, both being movable in the direction of the printing by making use of a shaft 12; element 10 is a printed circuit board for electrically mounting parts of a motor assembly as well as parts of the printing drive circuit and connecting them with each other; element 11 is an iron plate; element 12 is the shaft; element 13 is a printing head drive element element 14a is a space motor coil; elements 15 are screws for fixing the motor assembly composed of the printed circuit board 10 and the iron plate 11 with the carriage frame 9; element 16 is a bearing for a space motor shaft; element 17 is a connector for electrically connecting the circuit board 10 to the printing head 8, and elements 18 are screws for fixing radiating fins of the printing head drive elements 13 on the iron plate 11.

With the arrangement described above, the side of the control unit is constructed with only a control section without having any heat generating parts such as the drive elements, etc. Accordingly, the printing head drive circuit according to the present invention assures high density mounting and enables the drive circuit to be miniaturized for reducing the cost required therefor.

Since the printing head drive elements 13 mounted on the side of the carriage have the radiating fins thereof fixed on the iron plate 11 with screws as shown in FIG. 3, the iron plate 11 acts as a radiating plate for the printing head drive elements 13. In addition, since the iron plate 11 is connected to and fixed on the aluminum die casting carriage frame 9, which has an extensive radiating effect, by means of the screws 15 along their surfaces, the carriage frame 9 also acts as a heat sink. Furthermore, the shaft 12 also has a heat sink effect since it has only a thickness ranging from about 0.5 mm to 1 mm and furthermore makes surface-contact with the carriage frame 9 via a resin bushing fitted in the inner part of the carriage frame 9.

It should be noted here that the motor coil 14 and the printing head 8 also serve as head radiating parts in the same fashion as the printing head drive elements 13. However, since the whole structure of the carriage has a heat sink effect as described above, it is unnecessary to mount any particular heat sink and cooling fan as a cooling means thereon. Moreover, since the carriage is moved while effecting a printing opration, an air stream produced thereupon may also be available as a cooling means.

In addition, since the whole arrangement of the printer is completely independently divided into a control section, a drive circuit which generates heat, and a load section, the reliability of the drive circuit of the present invention may be sharply improved.

Furthermore, since the drive circuit according to the present invention is adapted to be mounted on the side of an object to be driven and thereby radiate the heat generated therein by making use of a metal base, etc., disposed on the side of the object to be driven, it may also the profitably employed for a space motor drive circuit of the printer.

Although a certain preferred embodiment has been shown and described, it should be understood that many changes and modifications may be made from the scope of the appended claims.

What is claimed is:

1. A carriage assembly for a printer, said carriage assembly comprising:
    a printed circuit board having opposite first and second planar surfaces;
    a thermally conducting plate having opposite first and second planar surfaces, said first planar surface of said thermally conducting plate being disposed along said first planar surface of said printed circuit board;
    drive elements disposed on said second planar surface of said thermally conducting plate and electrically connected to said printed circuit board;
    a plurality of space motor coils disposed on said second planar surface of said thermally conducting plate and electrically connected to said printed circuit board; and,
    a print head mounting means for mounting a print head thereon, said print head mounting means being fixedly mounted to said second planar surface of said printed circuit board.

2. A carriage assembly as recited in claim 1, for comprising:
    a thermally conducting carriage frame adapted to engage a thermally conducting carriage shaft of the printer; and,
    means for fixedly mounting said thermally conducting plate to said thermally conducting carriage frame so that said thermally conducting plate is thermally coupled to said thermally conducting carriage frame.

3. A carriage assembly as recited in claim 1, wherein said plurality of space motor coils are arranged to define a circle on said second planar surface of said thermally conducting plate, and wherein said carriage assembly further comprises a space motor shaft mounting means for engaging a motor shaft of a space motor, said space motor mounting means being disposed in said second planar surface of said thermally conducting plate at a center of said circle defined by said space motor coils.

4. A carriage assembly as recited in claim 3, for comprising:
    a thermally conducting carriage frame adapted to engage a thermally conducting carriage shaft of the printer; and,
    means for fixedly mounting said thermally conducting plate to said thermally conducting carriage frame so that said thermally conducting plate is thermally coupled to said thermally conducting carriage frame.

5. A carriage assembly as recited in claim 1, wherein each of said drive elements includes a radiating fin fixedly mounted to said second planar surface of said thermally conducting plate.

6. A carriage assembly as recited in claim 5, wherein said plurality of space motor coils are arranged to define a circle on said second planar surface of said thermally conducting plate, and wherein said carriage assembly further comprises a space motor shaft mounting means for engaging a motor shaft of a space motor, said space motor mounting means being disposed in said second planar surface of said thermally conducting plate at a center of said circle defined by said space motor coils.

7. A carriage assembly as recited in claim 6, for comprising:
    a thermally conducting carriage frame adapted to engage a thermally conducting carriage shaft of the printer; and, means for fixedly mounting said thermally conducting plate to said thermally conducting carriage frame so that said thermally conducting plate is thermally coupled to said thermally conducting carriage frame.

8. A carriage assembly as recited in claim 5, for comprising:
a thermally conducting carriage frame adapted to engage a thermally conducting carriage shaft of the printer; and,
means for fixedly mounting said thermally conducting plate to said thermally conducting carriage frame so that said thermally conducting plate is thermally coupled to said thermally conducting carriage frame.

* * * * *